United States Patent [19]
Camm

[11] Patent Number: 5,561,735
[45] Date of Patent: Oct. 1, 1996

[54] RAPID THERMAL PROCESSING APPARATUS AND METHOD

[75] Inventor: David M. Camm, Vancouver, Canada

[73] Assignee: Vortek Industries Ltd., Vancouver, Canada

[21] Appl. No.: 298,163

[22] Filed: Aug. 30, 1994

[51] Int. Cl.$^6$ .............................. F37B 5/14; F27D 11/02; H01L 21/324

[52] U.S. Cl. .................... 392/416; 219/405; 219/411; 392/424; 118/725

[58] Field of Search ................................. 392/416, 418, 392/423, 424; 219/390, 405, 411, 388; 118/724, 725, 50.1

[56] References Cited

U.S. PATENT DOCUMENTS

| | | | |
|---|---|---|---|
| 3,213,827 | 10/1965 | Jenkin | 118/725 |
| 4,027,185 | 5/1977 | Nodwell et al. | 313/35 |
| 4,482,393 | 11/1984 | Nishiyama et al. | 148/1.5 |
| 4,504,323 | 3/1985 | Arai et al. | 437/247 |
| 4,550,245 | 10/1985 | Arai et al. | 219/405 |
| 4,550,684 | 11/1985 | Mahawili | 118/724 |
| 4,649,261 | 3/1987 | Sheets | 219/390 |
| 4,700,102 | 10/1987 | Camm et al. | 313/24 |
| 4,755,654 | 7/1988 | Crowley et al. | 219/405 |
| 4,857,704 | 8/1989 | Jannot et al. | 219/405 |
| 4,937,490 | 6/1990 | Camm et al. | 313/12 |
| 4,958,061 | 9/1990 | Wakabayashi et al. | 219/411 |
| 4,981,815 | 1/1991 | Kakoschke | 437/173 |
| 5,073,698 | 12/1991 | Stultz | 219/405 |
| 5,155,336 | 10/1992 | Gronet et al. | 219/411 |
| 5,275,629 | 1/1994 | Ajika et al. | 118/725 |
| 5,279,973 | 1/1994 | Suizu | 437/25 |
| 5,317,429 | 5/1994 | Gronet et al. | 362/294 |
| 5,399,523 | 3/1995 | Kakoschke | 437/173 |
| 5,446,824 | 8/1995 | Moslehi | 392/416 |
| 5,487,127 | 1/1996 | Gronet et al. | 219/406 |

FOREIGN PATENT DOCUMENTS

| | | | |
|---|---|---|---|
| 8705054 | 8/1987 | WIPO . | |
| 9110873 | 7/1991 | WIPO . | |
| 94/01982 | 1/1994 | WIPO | 392/416 |

OTHER PUBLICATIONS

"Rapid Thermal Processing" Science and Technology. Edited by Richard B. Fair. Academic Press, Inc. Harcourt Brace Jovanovich, Publishers. Copyright © 1993 by Academic Press Inc. 1 *Rapid Thermal Processing—A Justification* by Richard B. Fair. (pp. 1–11). 8 *Issue in Manufacturing Unique Silicon Devices Using Rapid Thermal Annealing* by B. Lojek. (pp. 311–347). 9 *Manufacturing Equipment Issue in Rapid thermal Processing* by Fred Roozeboom (pp. 349–423).

*Primary Examiner*—Teresa J. Walberg
*Assistant Examiner*—J. Pelham
*Attorney, Agent, or Firm*—Bull, Housser & Tupper

[57] ABSTRACT

An apparatus and method for rapidly and uniformly heating a workpiece includes a plurality of walls defining a first chamber, a first source of radiation for producing incident radiation on a first energy transfer surface of the workpiece, a holder for holding the workpiece in a workpiece plane in the chamber and a radiation absorbing surface on at least one wall of the chamber. The holder has an energy transfer surface, the energy transfer surfaces of the holder and of the workpiece reflecting and emitting radiation in the chamber and the radiation absorbing surface particularly for absorbing radiation reflected and radiation emitted from the energy transfer surfaces.

50 Claims, 6 Drawing Sheets

RAPID THERMAL PROCESSING APPARATUS AND METHOD

BACKGROUND OF THE INVENTION

This invention relates to rapid thermal processing of a workpiece and more particularly relates to thermal processing of semiconductor wafers.

Rapid thermal processing reactors are commonly used to anneal semiconductor wafers. The operating parameters for these reactors are becoming more demanding as device spacing on semiconductor wafers is reduced. For example high temperature rapid thermal processing for devices with 0.25 μm spacings requires a temperature uniformity in the device of ±3 degrees celsius and for devices with 0.18 μm spacings a temperature uniformity of ±1 degree celsius is required.

Various others have attempted to uniformly irradiate a semiconductor wafer for using devices as described in U.S. Pat. No. 4,649,261 issued Mar. 10, 1987, to Sheets, U.S. Pat. No. 5,279,973 issued Jan. 18, 1994, to Suizu, U.S. Pat. No. 4,482,393 issued Nov. 13, 1984, to Nishiyama et al., U.S. Pat. No. 5,155,336 issued Oct. 13, 1992, to Gronet et at., U.S. Pat. No. 4,981,815 issued Jan. 1, 1991, to Kakoschke and U.S. Pat. No. 4,958,061 issued Sep. 18, 1990, to Wakabayashi et al. Generally, each of the references above discloses at least one light source and various reflector arrangements for directing at the semiconductor wafer light produced by the light source. Using conventional light sources, often a plurality of light sources are required and efficient use must be made of reflectors in order to achieve required radiation pattern on the wafter to achieve a desired thermal pattern in the wafer. The design of such reflectors and, in general, irradiating systems of the type described in the patents, normally are required to compensate for reflection, emission and absorption effects of the wafer itself. This is because the wafer can reflect and emit radiation which is reflected from various reflecting surfaces in the chamber back at the wafer, thereby creating local hot spots in the wafer. Furthermore, differences in geometry and thermal properties of various areas on the wafer can complicate the emissive, absorptive and reflective effects further contributing to localized hot spots in the wafer.

What would be desirable, therefore, is a system which uniformly irradiates the wafer and reduces the effects of radiation absorbed and reflected by the wafer. By reducing these effects, the required temperature uniformity for devices with spacings less than 1 μm can be achieved.

SUMMARY OF THE INVENTION

In accordance with one aspect of the invention, there is provided an apparatus for rapidly and uniformly heating a workpiece which includes a plurality of walls defining a first chamber, a first source of radiation for producing radiation which is incident upon a first energy transfer surface of the workpiece, a holder for holding the workpiece in a workpiece plane in the chamber and a radiation absorbing surface on at least one wall of the chamber. The holder has an energy transfer surface, the energy transfer surfaces of the holder and of the workpiece reflecting and emitting radiation in the chamber and the radiation absorbing surface absorbing radiation reflected and emitted from the energy transfer surfaces.

The radiation absorbing surface may include anodized stainless steel, anodized aluminum, black nickel coating, a paint containing graphite or other absorbing material.

Preferably, the apparatus includes a first reflector for reflecting radiation from the first source of radiation to achieve a desired thermal pattern in the workpiece by reflecting the radiation to achieve a desired radiation pattern incident on the workpiece. The first reflector may include a first reflector disposed behind the first source of radiation such that the first source of radiation is disposed between the first reflector and the workpiece.

Preferably, radiation from the first source is directed at the first surface of the workpiece at an angle of incidence less than 80 degrees to the first surface.

Preferably, at least one of the walls has a first opening for admitting radiation into the chamber, the first opening having a cross-sectional area of less than or equal to the area of the radiation absorbing surface.

Preferably, the first source of radiation includes a first high power inert gas arc such as a water wall are having an arc axis disposed generally parallel to the energy absorbing surface. Preferably, the first source of radiation produces radiation having at least 60% of its energy at wavelengths less than 1.2 μm and is operable to produce a radiation flux of at least 40 W/cm$^2$ at the first surface with a response time of less than 10 mSec.

Preferably, the apparatus includes a window covering the opening, the window having a partially reflecting surface disposed at an angle to the first surface, the window being disposed between the first source and the holder such that the radiation passes through the window and such that the partially reflecting surface of the window is operable to direct the radiation impinging upon the reflecting surface toward at least one of the radiation absorbing surfaces. The apparatus may include a cooler for cooling the window through contact with a fluid coolant.

Optionally, at least one of the radiation absorbing surfaces may be disposed such that the included angle between the workpiece plane and the radiation absorbing surface, inside the first chamber, is greater than 90 degrees.

Optionally, the included angle between the radiation absorbing surface and an adjacent wall of the first chamber is less than 90 degrees.

Optionally, the radiation absorbing surface includes a plurality of facets forming a generally sawtooth pattern in the surface, respective adjacent facets being disposed at less than 90 degrees to each other.

Optionally, the chamber may have at least one reflecting wall perpendicular to the arc axis.

A secondary source of radiation such as a xenon arc lamp may be provided in the first chamber for producing radiation for producing a desired radiation pattern on the workpiece.

A second chamber, may also be included in the apparatus, the first chamber being disposed on a first side of the workpiece plane and the second chamber being disposed on a second side of the workpiece plane, the second side being opposite the first side. The second chamber will have a plurality of walls, each wall having a reflecting surface for reflecting back to the workpiece radiation emitted by the workpiece. At least one second side reflector may be disposed opposite the second side, for reflecting back to the second surface radiation emitted by the second surface. The at least one reflector can be shaped to distribute reflected radiation onto the second side such that a substantially uniform temperature distribution is maintained over the second side. In addition the apparatus may include at least one edge reflector disposed adjacent edge portions of the workpiece, the edge reflector being operable to reflect back to the edge portions radiation emitted by the edge portions. The second side reflector and the edge reflector cooperate to distribute reflected radiation onto the second side and the edges such that a substantially uniform temperature distribution is maintained over the second side and the edges of the workpiece.

The apparatus may include a second source of radiation such as at least one short xenon arc lamp for irradiating a second surface of the workpiece, the second surface being on a side of the workpiece, opposite the first surface. Preferably, the second source of radiation is located in the second chamber and a second reflector for reflecting radiation from the second source of radiation is provided to achieve a desired thermal pattern in the workpiece by maintaining a desired radiation pattern on the second surface. Preferably, the second reflector includes a second reflector disposed behind the second source of radiation such that the second source is disposed between the second reflector and the workpiece.

Alternatively the second source may includes at least one tungsten lamp.

In accordance with another aspect of the invention, there is provided a method of rapidly and uniformly heating a workpiece, the method comprising the steps of:

a) directing radiation from a first radiation source at a first surface of the workpiece to produce radiation incident upon the first surface; and b) absorbing radiation reflected and radiation emitted from energy transfer surfaces including the first surface and surfaces in the vicinity of the first surface so that the first surface is exposed primarily only to radiation emitted directly from the radiation source.

The method may further include the steps of:

a) holding the workpiece in a first chamber;

b) admiring the radiation into the first chamber; and c) absorbing the radiation reflected and emitted from said energy transfer surfaces on radiation absorbing surfaces of at least one wall forming the first chamber.

In accordance with another aspect of the invention, there is provided a method of rapidly and uniformly heating a workpiece, the method comprising the steps of:

a) directing radiation from a first radiation source at a first surface of the workpiece to produce radiation incident upon the first surface;

b) directing radiation from a second radiation source at a second surface of the workpiece to produce incident radiation on the second surface, the first and second surfaces being disposed on opposite sides of the workpiece; and, c) absorbing radiation reflected and emitted from energy transfer surfaces, including the first and second surfaces and surfaces, in the vicinity of the workpiece.

The method may further include the steps of:

a) holding the workpiece in a chamber having a plurality of walls, at least one wall having a radiation absorbing surface;

b) admitting the radiation from the first and second sources into the chamber; and c) absorbing the radiation reflected and emitted from energy transfer surfaces on the radiation absorbing surface of the at least one wall.

The above described apparatus reduces the effects of wafer reflectivity and non-uniformity by absorbing virtually all of the wafer radiation before it can return to the wafer. The position of the source relative to the radiation absorbing surfaces and the radiation source causes radiation reflected from the wafer along with most of the thermal radiation from the wafer to reach the radiation absorbing surfaces of the walls of the chamber.

By using a gas arc, a reliable and reproducible radiation source is obtained. In addition, the arc described herein has a spectral distribution in which over 90% of the arc's radiation is below the 1.2 micron band gap absorption of cold silicon. Thus, virtually all of the arc radiation is strongly absorbed by silicon at all temperatures and very little passes through the wafer. In addition, an arc of the type described herein has a 1 mSec time response which provides improved control of heating profiles and facilitates easy, accurate temperature measurement. The spectral distribution of the arc causes most of the radiation impinging upon the wafer to be absorbed on the exposed surface of the wafer. At these wavelengths, power will not reach the wafer's second side (device side) by passing through the wafer. Minimizing the transfer of power through the wafer, minimizes pattern effects of the wafer and reduces any thermal gradient perpendicular to the surface of the wafer, which reduces thermal stress. This is particularly important for devices that involve insulating layers such as silicon on oxide.

BRIEF DESCRIPTION OF THE DRAWINGS

In drawings which illustrate embodiments of the invention.

DETAILED DESCRIPTION

Figure 1:
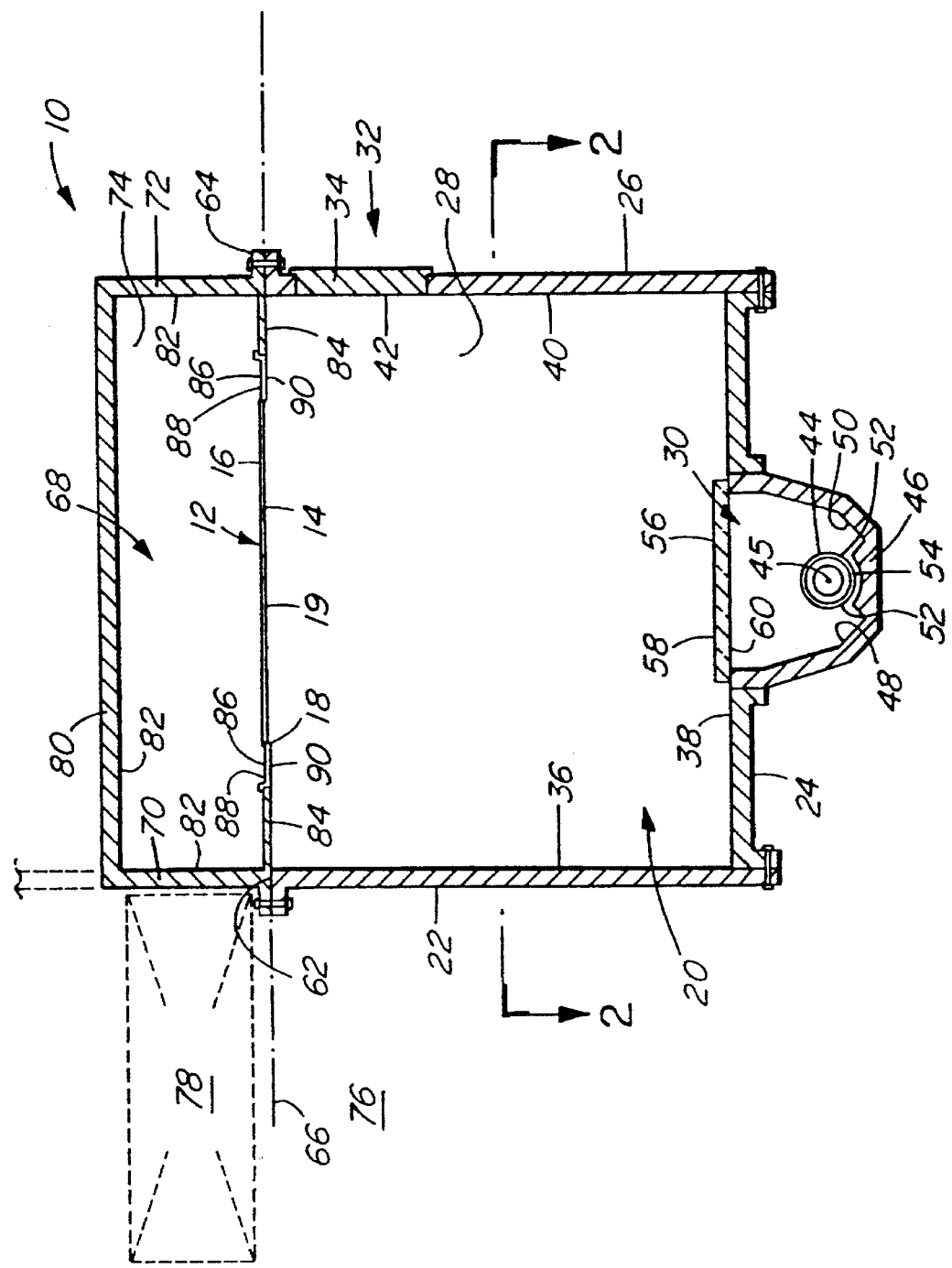
FIG. 1 is a cross-sectional view of an apparatus according to a first embodiment of the invention.

Referring to FIG. 1, an apparatus for rapidly and uniformly heating a workpiece is shown generally at 10. In this embodiment, the workpiece is a silicon wafer 12 having a first surface 14, a second surface 16 disposed opposite the first surface and a circular edge portion 18 defining a circular perimeter of the wafer and surrounding a central portion 19 of the wafer 12. The first surface 14 is generally a substrate side while the second surface 16 is generally a device side. It will be appreciated that the first side generally has a uniform heat coefficient while the second side has areas of different heat coefficients. It will further be appreciated that the first and second sides of the wafer act as energy transfer surfaces which are operable to absorb radiation, resulting in thermal heating of the wafer, are operable to reflect a portion of radiation impinging thereupon and are operable to emit heat radiation, depending upon the temperature of the wafer 12.

Figure 2:
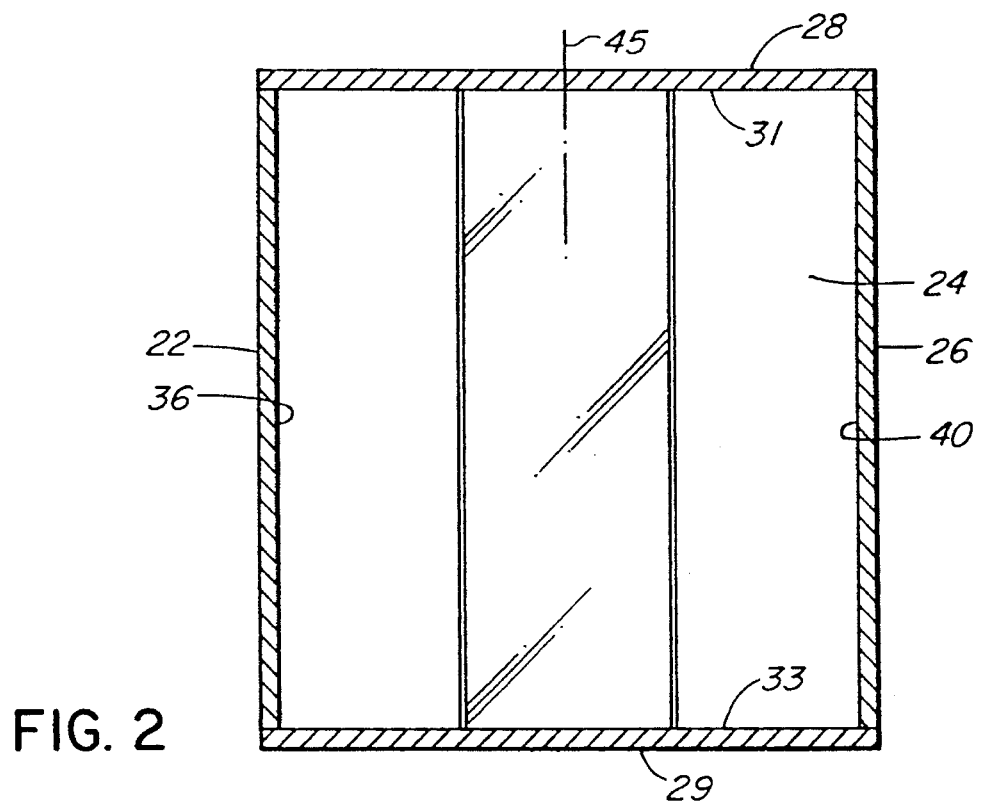
FIG. 2 is a cross-sectional view of the apparatus of FIG. 1 taken along lines 2—2 of FIG. 1.

The apparatus 10 includes a plurality of walls defining a first chamber 20. In this embodiment, there are first, second and third walls 22, 24 and 26 which extend at right angles to the plane of the drawing, each disposed at right angles to each other, and fourth and fifth walls extending parallel to the plane of the drawing. Referring to FIG. 2, the fourth wall is shown at 28 and the fifth wall is shown at 29. Referring back to FIG. 1, the first wall 22 generally has no discontinuities, the second wall 24 has a first opening 30 therein and the third wall has an access opening 32 generally for robotic access. When robotic access is not in progress, the access opening 32 is closed by a removable cover 34. Referring to FIG. 2, the fourth and fifth walls 28 and 29 generally have no discontinuities.

Referring to FIG. 1, in this embodiment, walls 22, 24, and 26 and the access opening cover 34 (seen in FIG. 1) are formed from anodized stainless steel such that least one inner facing surface of each wall is black in colour and radiation absorptive. Hence walls 22, 24 and 26 have respective radiation absorbing surfaces 36, 38, and 40, each having a surface area operable to absorb radiation impinging thereon, from inside the enclosure. Each of the walls 22, 24, 26 may be water cooled using conventional methods.

Referring to FIG. 2, the remaining walls 28 and 29 are coated with a highly reflective surface coating such as aluminum and have respective reflecting surfaces 31 and 33.

Referring back to FIG. 1, preferably, the first opening 30 in the second wall 24 has a cross-sectional area of less than or equal to the area of the total radiation absorbing surface area in the first chamber and provides an aperture through which radiation is admitted into the first chamber 20. The total radiation surface area is the sum of the surface area of each of the radiation absorbing surfaces in the first chamber. Generally, it is desirable to maximize the radiation absorbing surface area while minimizing the cross-sectional area of the first opening 30 to enable the radiation absorbing surfaces to absorb as much radiation as possible from the interior of the first chamber 20.

A first high power inert gas arc 44 having an arc axis 45, is secured about the first opening 30 such that the arc axis is parallel to the radiation absorbing surfaces 36, 38 and 40 and perpendicular to the reflecting surfaces 28 and 29. The high power arc acts as a first source of radiation for producing radiation incident upon the first energy transfer surface 14 of the wafer 12. The high power inert gas arc is preferably a water wall arc, of the type described in U.S. Pat. No. 4,027,185, issued May 31, 1977 to Nodwell et at., U.S. Pat. No. 4,700,102 issued Oct. 13, 1987 to Camm et at., and U.S. Pat. No. 4,937,490 issued Jun. 26, 1990 to Camm et al., the disclosures of which are incorporated herein by reference.

Generally, for processing silicon wafers it is preferred that the gas arc 55 be capable of producing radiation having at least 95% of its energy content at wavelengths less than $1.2 \times 10^{-6}$ meters and be capable of producing a radiation flux in the range of 30–100 $W/cm^2$ and preferably 50 $W/cm^2$ at the first surface 14. This level of radiation flux is sufficient to provide enough radiant energy in the first chamber 20 to heat the wafer 12 while radiation reflected from the wafer 12 is absorbed by the radiation absorbing surfaces 36, 38 and 40 or is reflected onto these surfaces by the reflecting surfaces 31 and 33 of walls 28 and 29 shown in FIG. 2. In other words, the apparatus does not rely on any reflected radiation from the wafer to heat the wafer, rather the entire heating effect is due primarily to the radiation directly from the first source of radiation.

Referring back to FIG. 1, the gas arc 44 should also be capable of achieving an on/off response time of less than 10 mSec and preferably 1 mSec which is much less time than the thermal time constant of the wafer. This allows the radiation to be momentarily deactivated to permit temperature measurements or thermal images to be taken without the influence of source radiation and allows the radiation to be quickly reactivated to resume and maintain the temperature of the wafer 12. It also allows very accurate temperature profiles of the wafer 12 to be acquired, using conventional temperature and thermal imaging equipment.

One possible application of the arc's fast time constant is to compare wafer radiation with the arc on and off to measure both reflective and thermal radiation. These real time measurements of reflectivity can be used to calculate emissivity and when combined with thermal radiation measurements give temperature. The absorbing chamber eliminates the cavity effect that would be created by a reflecting chamber so true wafer emissivity can be measured. An estimate of the hemispherical reflectivity can be obtained by careful positioning of an imaging detector that resolves the wafer in two dimensions and using the know spatial and angular distribution of irradiance on the wafer.

During heating of the wafer 12, different areas of the wafer 12 will generally emit radiation at different rates. Therefore a first reflector 46 is disposed behind the gas arc 44, parallel to the axis of the gas arc such that the gas arc 44 is disposed between the first reflector 46 and the wafer 12, to reflect and thus control the radiation flux distribution from the gas arc 44 to achieve a desired radiation pattern incident on the wafer 12. The reflecting walls 28 and 29 also assist in forming this desired radiation pattern, the pattern being a generally uniform flux distribution over the entire first surface 14 of the wafer 12.

This is achieved by forming the reflector 46 with first and second angled portions 48 and 50 such that portions of radiation directly emanating from the gas arc 44 are reflected by the first and second angled portions 48 and 50 which concentrate and direct portions of this radiation at the edge portion 18 of the wafer 12. The reflecting surfaces 31 and 33 also reflect some of the radiation emitted by the first source onto the wafer 12. These surfaces produce respective images of the gas arc which causes the arc to appear longer than it really is which helps produce a uniform radiation pattern past the end portions of the arc. Hence, the first reflector 46 and the reflecting walls 28 and 30 effectively control magnitude and direction of radiation from the first source of radiation to achieve a desired radiation pattern on the first surface 14. The effect of this uniform radiation pattern is to create a generally uniform temperature distribution across the first surface 14. It will be appreciated that using conventional reflector design techniques, a suitable first reflector can be designed to create most practical radiation patterns.

A window 56 is disposed over the first opening 30 and separates the gas arc 44 from the first chamber 20, while permitting radiation from the gas arc 44 and first reflector 46 to pass into the chamber 20 through the first opening 30. Generally, the window is of conventional quartz design and permits most of the radiation incident on first and second surfaces thereof to pass therethrough however, some radiation is reflected. Hence the window may be considered to have first and second partially reflecting surfaces 58 and 60.

It will be appreciated that the wafer 12 reflects and emits radiation in all directions, some of which intersect the radiation absorbing surfaces 36, 38 and 40 of the walls and some of which intersect the first partially reflecting surface 58 of the window 56. This reflected and emitted radiation which impinges on the walls 22, 24 and 26 of the chamber 20 is absorbed by the radiation absorbing surfaces 36, 38 and 40. Some of the reflected and emitted radiation which impinges upon the window 56 passes through the window and is reflected back into the chamber 20 by the first reflector 46 while some of this radiation is reflected by the window 56 back into the chamber 20. To avoid excessive reflection of this radiation by the first reflector 46, it is desirable to keep the first opening 30 and hence the window 56 as small as possible while still permitting enough radiation from the gas arc 44 to enter the chamber 20 to irradiate the first surface 14 of the wafer 12 with the above mentioned 50 W/cm$^2$ radiation flux. Use of the high powered gas arc 44 makes this possible as it is so powerful that it produces sufficient radiation through the relatively small first opening 30 to irradiate the wafer with the required flux intensity.

The first, third, fourth and fifth (not shown) walls 22, 26 and 28 have respective outer side edges only two of which are shown at 62 and 64 which lie in a workpiece plane 66. To these edges is connected a second chamber 68 having similar walls, only three of which are shown at 70, 72 and 74. The first chamber 20 is thus disposed on a first side 76 of the workpiece plane 66 while the second chamber 68 is disposed on a second side 78 of the workpiece plane 66, the second side 78 being opposite the first side 76.

The second chamber 68 also has a bottom portion 80 connecting each of the walls 70, 72, 74 together such that when the second chamber 68 is connected to the first chamber 20 the enclosed space is completely enclosed. The walls 70, 72 and 74 of the second chamber 68 and the bottom portion 80 of the second chamber 68 are each coated with a highly reflecting surface coating 82 such as aluminum for reflecting back to the wafer 12 radiation emitted by the wafer.

The walls 70, 72, 74 of the second chamber 68 are terminated in an inwardly directed flange portion 84 to which is connected an annular workpiece holder 86. The workpiece holder has first and second main energy transfer surfaces 88 and 90, each of which is operable to reflect and emit radiation into either the first or second chambers 20, 68. It will be appreciated that energy reflected or emitted by these surfaces 88 and 90, which enters the first chamber 20 can be expected to be readily absorbed by the radiation absorbing surfaces 36, 38, 40, 42 of the walls 22, 24, 26 in the first chamber 20 while energy which enters the second chamber 68 will be reflected by the highly reflecting surface coating 82 on the walls 70, 72 and 74 and bottom portion 80 of the second chamber 68.

Alternatives

Alternatively, the walls of the first chamber 20 may be made from anodized aluminum, in which case the radiation absorbing surface includes anodized aluminum, or the walls may be made from virtually any other metal or thermal conductive material and coated with a black nickel coating or a black paint coating containing graphite, where either of these two coatings acts as the radiation absorbing surface.

Figure 3:
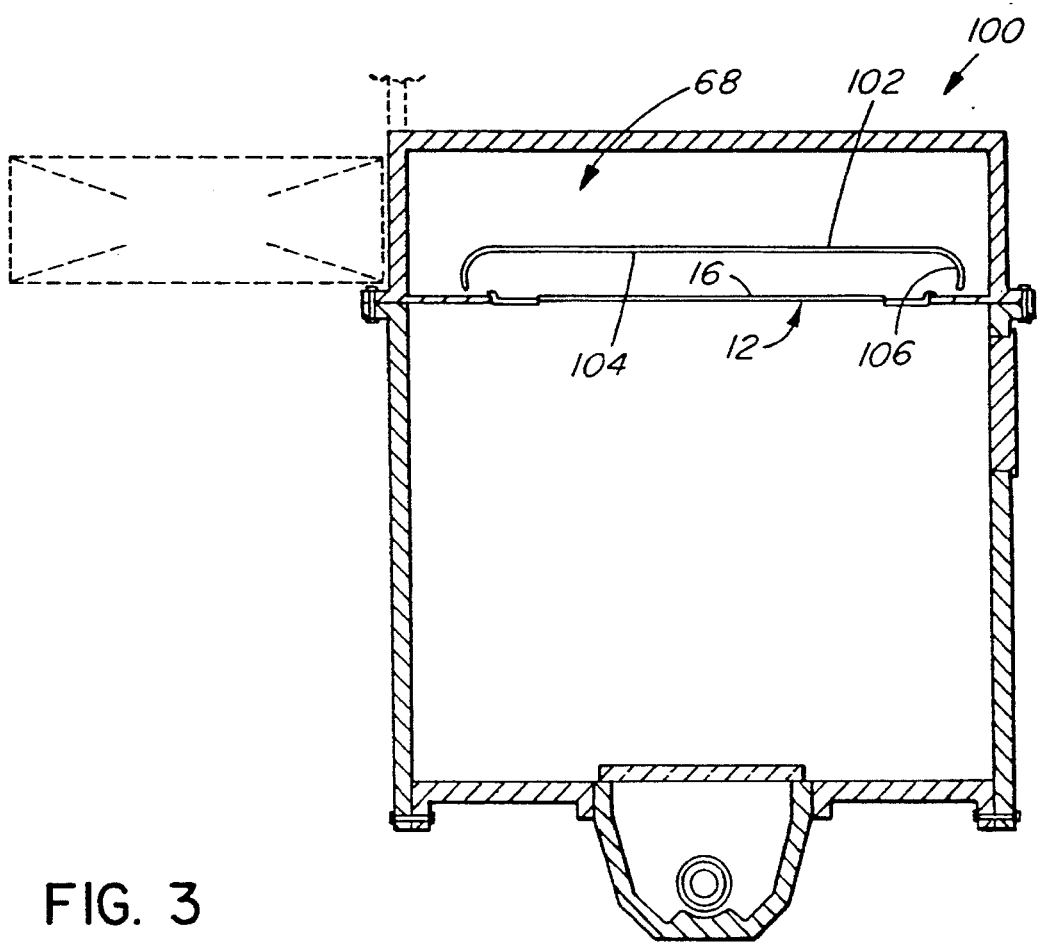
FIG. 3 is a cross-sectional view of an apparatus according to a second embodiment of the invention.

Referring to FIG. 3, an apparatus according to a second embodiment of the invention is shown generally at 100. The apparatus is similar to the apparatus shown in FIG. 1, with exception that an integrated second reflector 102 including a second side reflector portion 104 and an edge reflector portion 106 is located in the second chamber 68, opposite the second surface 16 of the wafer 12, for reflecting back to the second surface 16 and edge portion 18 of the wafer 12 radiation emitted by the second surface 16 and edge portion 18. The second reflector 102 cooperates to distribute reflected radiation on the second surface 16 and edge portion 18 such that the greater amount of radiation emitted by the edge portion 18 compared to the central portion 19 of the wafer 12 is concentrated and reflected back at the edge portions 18 such that a substantially uniform temperature distribution is maintained over the second surface 16 and edge portion 18 of the wafer 12.

Figure 4:
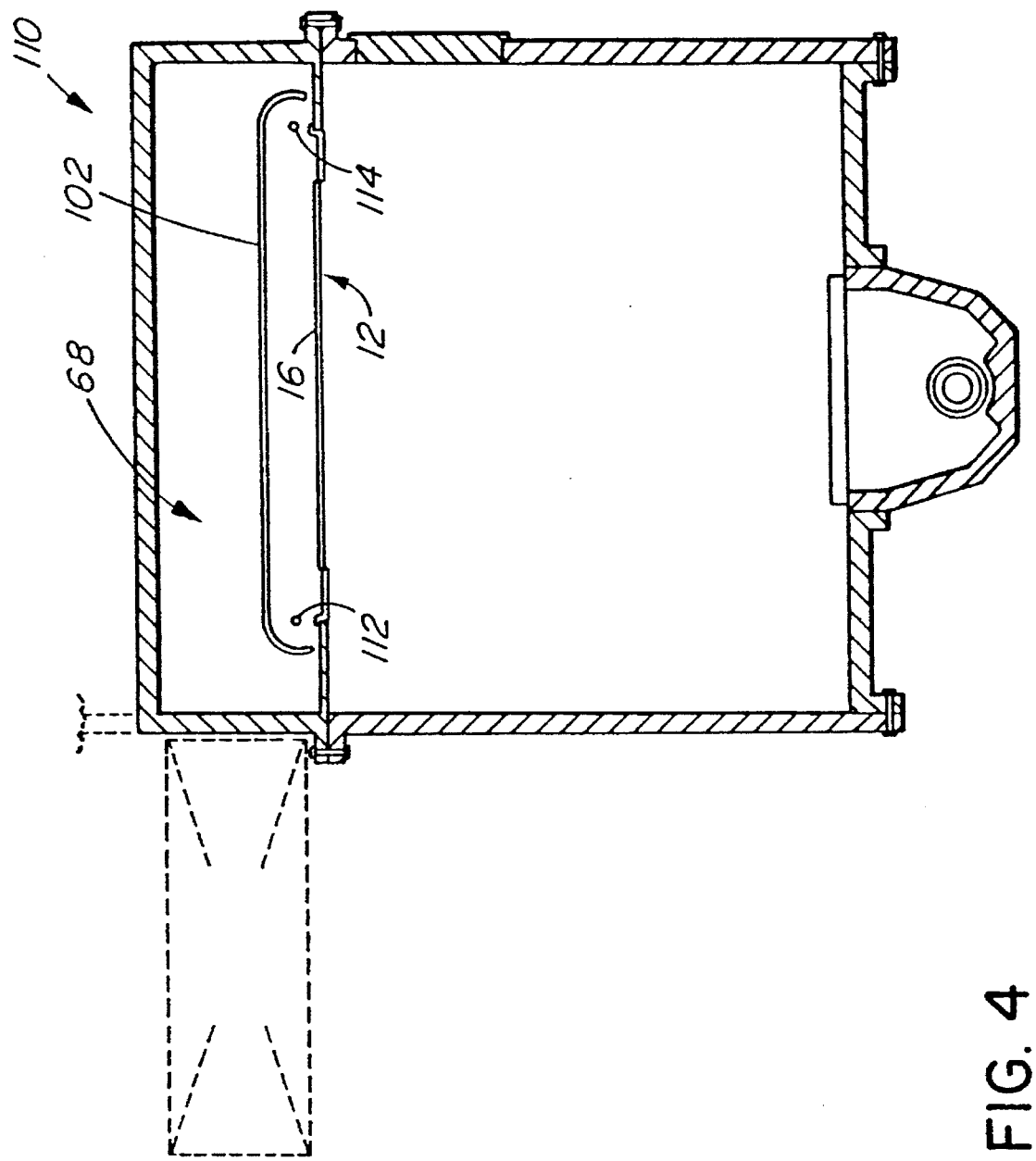
FIG. 4 is a cross-sectional view of an apparatus according to a third embodiment of the invention.

Referring to FIG. 4, an apparatus according to a third embodiment of the invention is shown generally at 110. The apparatus is similar to the apparatus shown in FIG. 2, with the exception that a second source of radiation, including first and second xenon arc lamps 112 and 114 is provided in the second chamber 68, between the wafer 12 and the second reflector 102, for irradiating the second surface 16 of the wafer.

The second reflector 102 is operable to reflect back at the second surface 16 radiation emitted by the xenon arc lamps 112 and 114 and radiation emitted and reflected by the second surface 16 to achieve a desired radiation pattern on the second surface 16 to maintain a desired uniform temperature distribution across the second surface 16.

Use of the second source of radiation is contemplated where very accurate control of the temperature distribution of the second surface 16 is required.

Alternatively, in this embodiment the second source of radiation may be provided by at least one tungsten lamp (not shown).

Alternately, a ring-like temperature security member of the type described in U.S. Pat. No. 4,958,061, incorporated herein by reference, may be employed to balance the absorption and emission of radiation from the edge portion 18. As a further alternative, a hemispherically-shaped screen of the type described in U.S. Pat. No. 4,981,815 to Kakoschke on Jan. 1, 1991, incorporated herein by reference, may be employed around the edge portion. Or an annular light source and a reflector surrounding the light source, of the type described in U.S. Pat. No. 4,981,815 may be employed around the edge portion.

The apparatus according to the first embodiment, shown in FIGS. 1 and 2, may introduce a irradiance non-uniformity of a few percent of the wafer radiation due to the position of the window. In addition, the window adds to thermal memory of the chamber. During processing the window will be heated by radiation from the source as well as by thermal radiation from the wafer. The window is transparent to most of the lamp radiation but absorbs most infrared radiation from the wafer. Since the points on the window opposite the wafer centre receive more radiation than points near the edge, a radial temperature gradient will be created in the window centred on the wafer. Subsequent wafers will be exposed to the non-uniform window depending upon the number of wafers processed, on window cooling, on thermal properties of the window and on the process cycle. The effects of the window are reduced by repositioning it and making some modifications as shown in FIG. 5.

Figure 5:
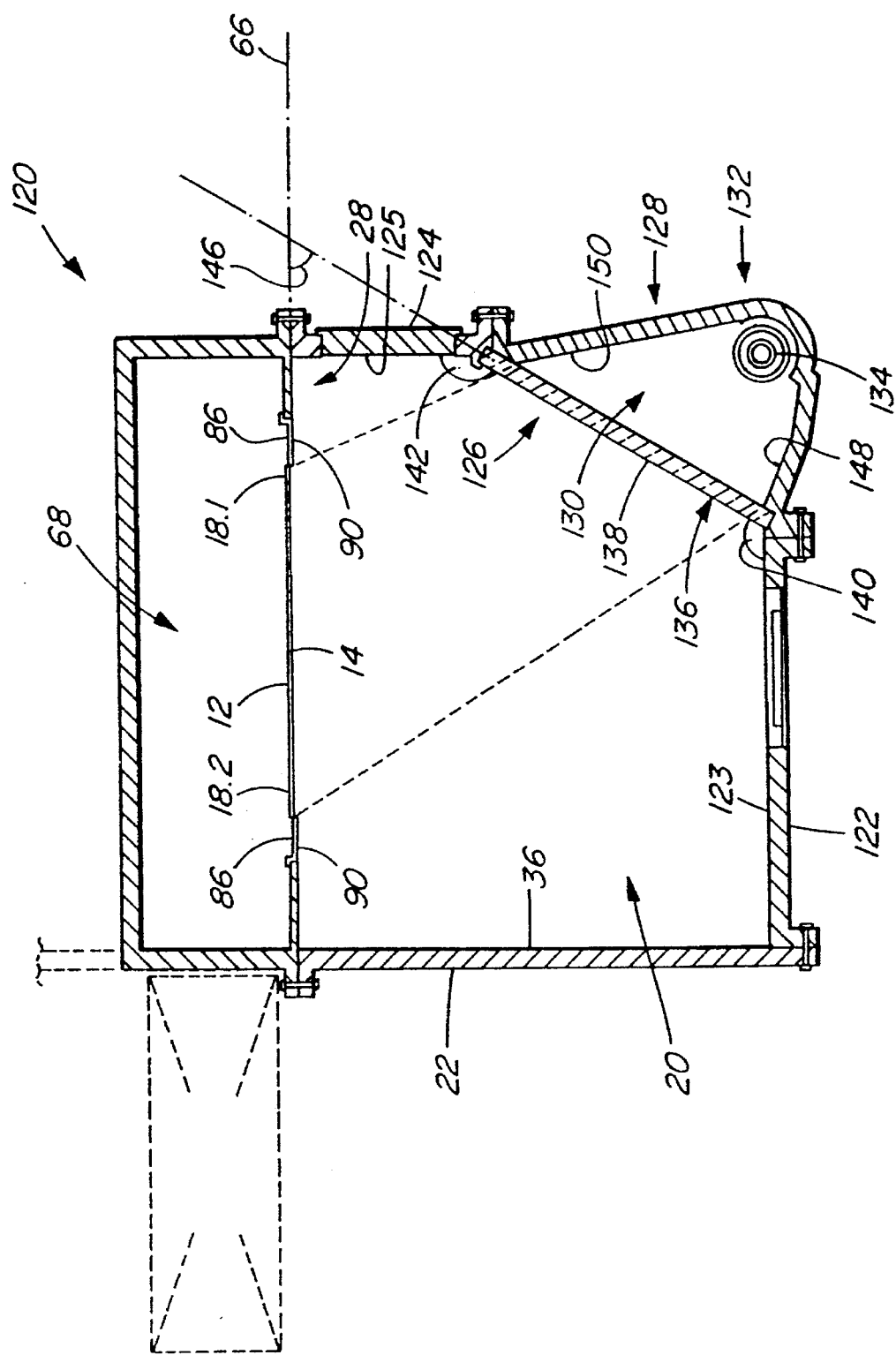
FIG. 5 is a cross-sectional view of an apparatus according to a fourth embodiment of the invention.

Referring to FIG. 5, an apparatus according to a fourth embodiment of the invention is shown generally at 120. The apparatus includes a first chamber 20 formed by first 22, fourth 28 and fifth (not shown) walls and a second chamber 68, similar to corresponding components of the embodiment shown in FIG. 1, however, the apparatus has second and third walls 122 and 124 which are different from corresponding walls of the embodiment shown in FIG. 1. The second and third walls 122 and 124 do, however, have respective radiation absorbing surfaces 123 and 125.

In particular, the second wall 122 extends from the first wall 22 only approximately ¾ of the distance to the third wall 124. Also, the third wall 124 extends only approximately ⅓ of the distance to the second wall 122, leaving a first opening 126 between the second and third walls 122 and 124. A first asymmetrical reflector 128 having a reflector mouth portion 130 is connected between the second and third walls 122 and 124 to form a corner portion 132 of the first chamber 20. A high power gas arc 134 of the type described in connection with FIG. 1 is disposed within the reflector 128. A window 136 having a partially reflecting surface 138 as described above extends between the second and third walls 122 and 124 to lie at a first obtuse angle 140 relative to the second wall 122 and at a second obtuse angle 142 relative to the third wall 124, hence the window 136 is disposed at an angle 146 to the first surface 14 of the wafer 12. The window 136 covers the mouth opening 130 of the reflector 128 such that the window 136 is disposed between the gas arc 134 and the holder 86 such that radiation passes through the window 136 and such that the partially reflecting surface 138 is operable to direct radiation emitted and reflected by energy transfer surfaces such as 14 and 90 in the first chamber 20 toward at least one of the radiation absorbing surfaces 36, 123, 125 of the walls 22, 122, 124 of the first chamber 20.

The reflector is asymmetrical in that it has first and second side portions 148, 150 of different lengths. The first side portion 148 is adjacent the second wall 122 and is relatively short compared to the second side portion 150, which is disposed adjacent the third wall 124. The first side portion 148 is operable to reflect radiation generally upwardly toward the entire surface of the wafer, although the right hand side edge portion 18.1 of the wafer 12, which is relatively near to the gas arc 134 receives more radiation. The second side portion 150 is operable to reflect radiation preferentially upwardly toward the left hand side edge portion 18.2 of the wafer 12, which is relatively distant from the gas arc 134. The larger size of the second side portion 150 acts to direct more radiation to the farther edge portion 18.2 to compensate for the generally non-uniform radiation pattern produced by the smaller second side portion to obtain a relatively uniform distribution of radiation on the first surface 14. This achieves a relatively uniform temperature distribution over the first surface 14.

In this embodiment, thermal memory is reduced because the window receives less radiation and therefore stays cooler. The window's small size and large distance from the wafer reduces radiation transfer back to the wafer and makes the contribution more uniform. The wafer image in the window is not a major concern because radiation from the wafer that is reflected by the window is directed to the highly absorbing chamber walls and does not return to the wafer. The small solid angle subtended by the window, the larger distance and angle of the window needed to direct reflected light away from the wafer is possible because of the relatively small reflector and large distance to the wafer made possible by the extremely high power and small volume of the gas arc.

Optionally, the window may be cooled by a cooling system as described in Published Canadian Patent Application No. 2,113,772, published Jul. 22, 1994, incorporated herein by reference, which transfers heat from the window through contact with a fluid coolant.

Figure 6:
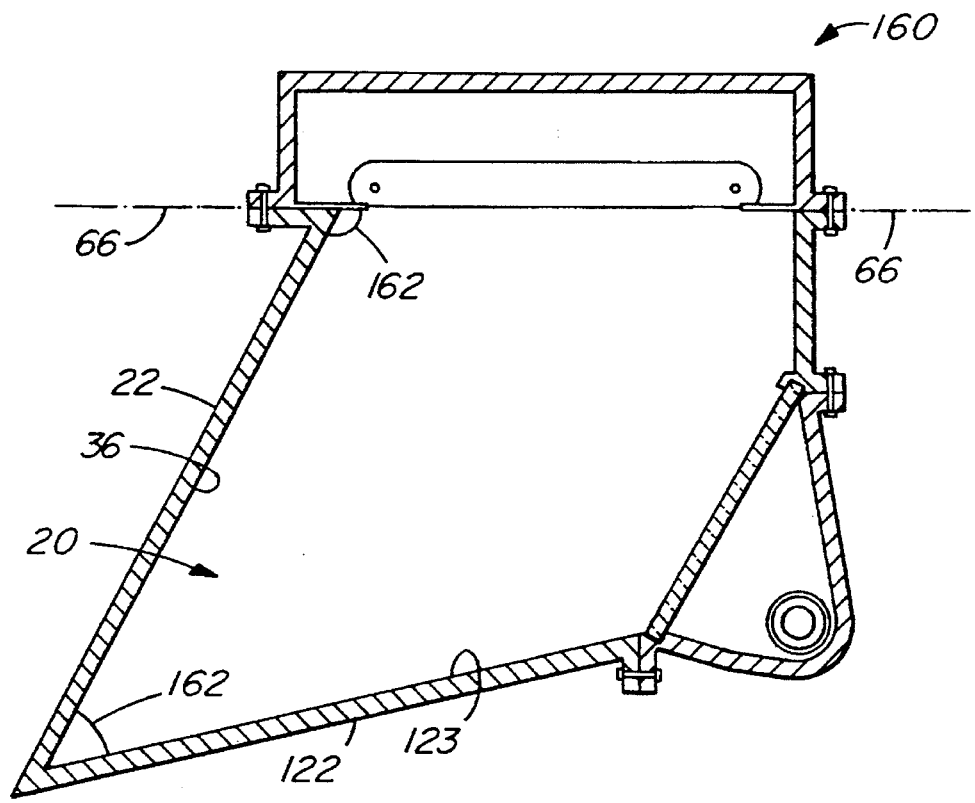
FIG. 6 is a cross-sectional view of an apparatus according to a fifth embodiment of the invention.

Referring to FIG. 6, an apparatus according to a fifth embodiment of the invention is shown generally at 160. Generally, the fifth embodiment is similar to the embodiment described in FIG. 4, with the exception that the first and second walls 22 and 122 are disposed such that an included angle 162 between the workpiece plane 66 and the radiation absorbing surface 36 on the first wall, inside the first chamber 20, is greater than 90 degrees and such that the included angle 164 between the radiation absorbing surface 36 on the first wall 22 and the radiation absorbing surface 123 on the second wall 122 is less than 90 degrees. This wall orientation tends be more effective at absorbing radiation reflected and emitted by the energy transfer surfaces than previously described embodiments.

Figure 7:
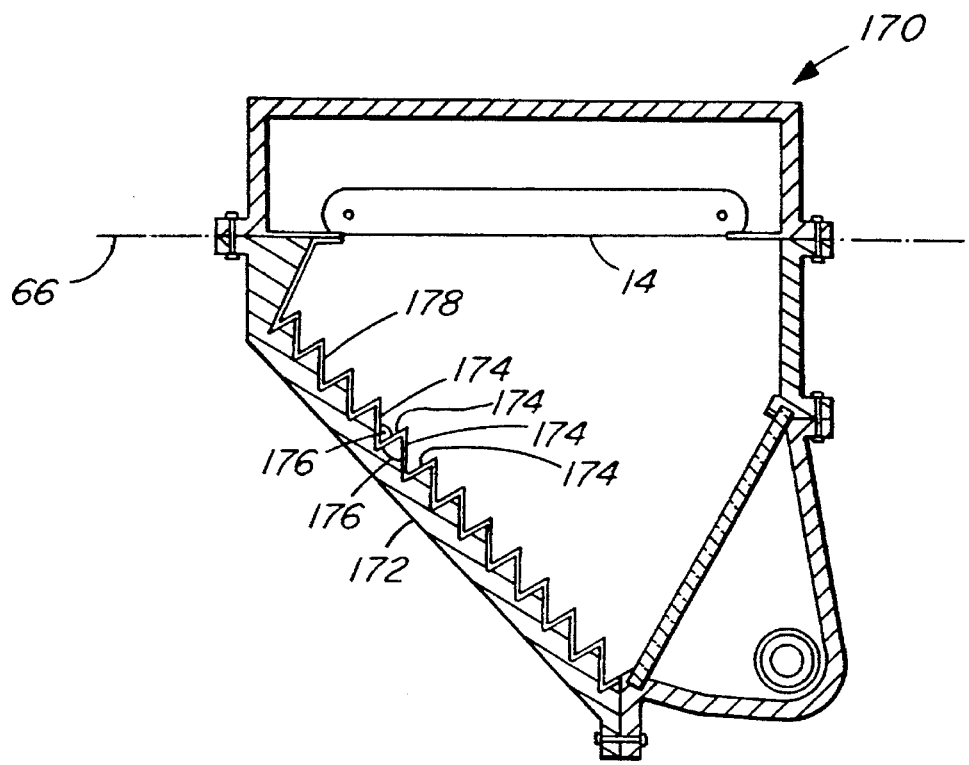
FIG. 7 is a cross-sectional view of an apparatus according to a sixth embodiment of the invention.

Referring to FIG. 7, an apparatus according to a sixth embodiment of the invention is shown generally at 170. The apparatus according the sixth embodiment essentially eliminates the first and second walls shown in FIGS. 1–5 and replaces these walls with a single wall 172 having a plurality of facets 174 forming a generally sawtooth pattern. Respective adjacent facets are disposed at angles 176 less than 90 degrees to each other and are covered with a radiation absorbing coating 178 including black graphite. The facets 174 are disposed relative to the workpiece plane such that radiation reflected and emitted from the second surface strikes the facets 174 at a relatively low angle of incidence which reduces any reflective effects of the facets 174 and enhances the absorption of the first chamber 20. This embodiment provides efficient absorption of emitted and reflected radiation from the first surface 14.

Figure 8:
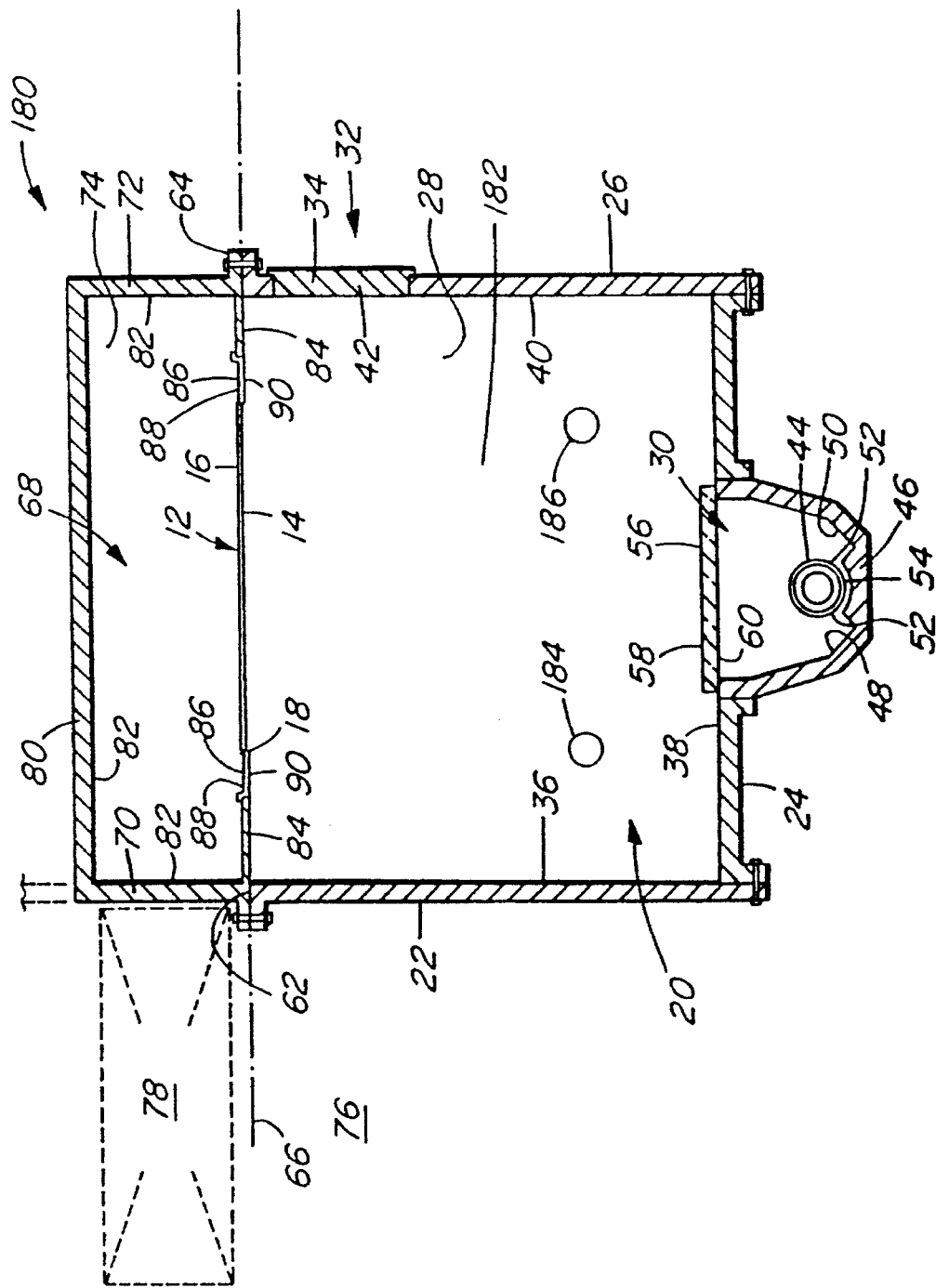
FIG. 8 is a cross-sectional view of an apparatus according to a seventh embodiment of the invention.

Referring to FIG. 8, an apparatus according to a seventh embodiment of the invention is shown generally at 180. The apparatus according to the seventh embodiment is essentially identical to the apparatus described with respect to FIGS. 1 and 2 with the exception that it includes a secondary source of radiation 180 in the first chamber 20 for producing further radiation to provide more control over the desired radiation pattern on the workpiece. In this embodiment the secondary source of radiation includes first and second xenon arc lamps 184 and 186 which are shown schematically disposed on opposite sides of the first window 30. This arrangement could, for example, produce a radially varying intensity pattern on the first side 14 of the wafer 12.

While a plurality of embodiments have been described, each has its own strengths and weaknesses. For example, the embodiment shown in FIGS. 1 and 2 relates to a basic design which provides good temperature uniformity in the wafer. The embodiment shown in FIG. 3 provides improved uniformity over that of FIG. 1 but at greater cost. The embodiment shown in FIG. 4 provides greater compensation for the effects created by patterned wafers. The embodiment shown in FIG. 5 provides better temperature uniformity than in the previous embodiments. The embodiments shown in FIGS. 6 and 7 more reliably produces a suitable radiation pattern on the wafer and provides high temperature uniformity in the wafer. The embodiment shown in FIG. 8 provides the best performance but is considerably more complicated than the previous embodiments.

The above apparatus provides improved temperature uniformity independent from wafer properties. The apparatus balances energy losses through the device side of the wafer and edge while heating and cooling entirely through the substrate side of the wafer. The first chamber is operable to absorb radiation reflected and emitted from the wafer thus removing any dependency on wafer properties to create the desired radiation pattern. The source and reflector constitute a small portion of the first chamber thus providing easy access to the wafer for diagnostic and temperature measurement purposes.

While specific embodiments of the invention have been described and illustrated, such embodiments should be considered illustrative of the invention only and not as limiting the invention as construed in accordance with the accompanying claims.

What is claimed is:

1. An apparatus for rapidly and uniformly heating a workpiece, the apparatus comprising:
   a) a plurality of walls defining a first chamber;
   b) a first source of radiation for producing radiation which is incident upon a first energy transfer surface of said workpiece;
   c) a holder for holding the workpiece in a workpiece plane in said chamber, said holder having an energy transfer surface, the energy transfer surfaces of the holder and of the workpiece reflecting and emitting radiation in said chamber;
   d) a radiation absorbing surface on at least one wall of said chamber particularly for absorbing radiation reflected and radiation emitted from said energy transfer surfaces.

2. An apparatus as claimed in claim 1 wherein said radiation absorbing surface includes anodized stainless steel.

3. An apparatus as claimed in claim 1 wherein said radiation absorbing surface includes anodized aluminum.

4. An apparatus as claimed in claim 1 wherein said radiation absorbing surface includes black nickel coating.

5. An apparatus as claimed in claim 1 wherein said radiation absorbing surface includes paint containing graphite.

6. An apparatus as claimed in claim 1 further including a first reflector for reflecting radiation from the first source of radiation to achieve a desired radiation pattern on the workpiece.

7. An apparatus as claimed in claim 6 further including a secondary source of radiation in the first chamber for producing further radiation for producing a desired radiation pattern on the workpiece.

8. An apparatus as claimed in claim 7 wherein said secondary source of radiation includes a xenon arc lamp.

9. An apparatus as claimed in claim 6 wherein said first reflector is disposed behind the first source of radiation such that the first source of radiation is disposed between the first reflector and said workpiece.

10. An apparatus as claimed in claim 1 wherein radiation from the first source is directed at the first surface of the workpiece at an angle of incidence less than 80 degrees to the first surface.

11. An apparatus as claimed in claim 1 wherein at least one of said walls has a first opening for admitting radiation into the chamber, the first opening having a cross-sectional area of less than or equal to the area of said radiation absorbing surface.

12. An apparatus as claimed in claim 1 wherein said first source of radiation includes a first high power inert gas arc having an arc axis.

13. An apparatus as claimed in claim 12 wherein said energy absorbing surface is disposed generally parallel to the arc axis.

14. An apparatus as claimed in claim 12 wherein said chamber has at least one reflecting wall perpendicular to the arc axis.

15. An apparatus as claimed in claim 12 wherein said first high power inert gas arc includes a water wall arc.

16. An apparatus as claimed in claim 1 wherein said first source of radiation produces radiation having at least 95% of its energy at wavelengths less than $1.2 \times 10^{-6}$ meters.

17. An apparatus as claimed in claim 1 wherein said first radiation source is operable to produce a radiation flux of at least 40 W/cm$^2$ at said first surface.

18. An apparatus as claimed in claim 1 wherein said first radiation source has a response time of less than 10 mSec.

19. An apparatus as claimed in claim 1 further including a second chamber, the first chamber being disposed on a first side of said workpiece plane and the second chamber being disposed on a second side of said workpiece plane, said second side being opposite said first side.

20. An apparatus as claimed in claim 19 wherein said second chamber has a plurality of walls, each wall having a reflecting surface for reflecting back to the workpiece radiation emitted by said workpiece.

21. An apparatus as claimed in claim 20 further including at least one second side reflector disposed opposite said second side, for reflecting back to said second surface radiation emitted by said second surface.

22. An apparatus as claimed in claim 21 wherein said at least one reflector is shaped to distribute reflected radiation onto said second side such that a substantially uniform temperature distribution is maintained over said second side.

23. An apparatus as claimed in claim 22 further including at least one edge reflector disposed adjacent edge portions of said workpiece, said edge reflector being operable to reflect back to said edge portions radiation emitted by said edge portions.

24. An apparatus as claimed in claim 23 further including:
   a) at least one second side reflector disposed opposite said second side, for reflecting back to said second surface radiation emitted by said second surface;
   b) at least one edge reflector disposed adjacent edge portions of said workpiece, said edge reflector being operable to reflect back to said edge portions radiation emitted by said edge portions,
   said second side reflector and said edge reflector cooperating to distribute reflected radiation onto said second side and said edges such that a substantially uniform temperature distribution is maintained over said second side and said edges of said workpiece.

25. An apparatus as claimed in claim 24 further including a second source of radiation for irradiating a second surface of the workpiece, the second surface being on a side of the workpiece, opposite the first surface.

26. An apparatus as claimed in claim 25 wherein the second source of radiation is located in the second chamber.

27. An apparatus as claimed in claim 26 further including a second reflector for reflecting radiation from the second source of radiation to achieve a desired radiation pattern on the workpiece.

28. An apparatus as claimed in claim 27 wherein said second reflector is disposed behind the second source of radiation such that said second source is disposed between the second reflector and said workpiece.

29. An apparatus as claimed in claim 25 wherein said second source includes at least one short xenon arc lamp.

30. An apparatus as claimed in claim 25 wherein said second source includes at least one tungsten lamp.

31. An apparatus as claimed in claim 11 further including a window covering said opening, said window having a partially reflecting surface disposed at an angle to the first surface, said window being disposed between said first source and said holder such that said incident radiation passes through said window and such that said partially reflecting surface of said window is operable to direct the non-incident radiation impinging upon the reflecting surface toward at least one of the radiation absorbing surfaces.

32. An apparatus as claimed in claim 31 further including a cooler for cooling said window through contact with a fluid coolant.

33. An apparatus as claimed in claim 1 wherein said at least one of said radiation absorbing surfaces is disposed such that the included angle between the workpiece plane and said at least one radiation absorbing surface, inside the first chamber, is greater than 90 degrees.

34. An apparatus as claimed in claim 1 wherein the included angle between said at least one radiation absorbing surface and an adjacent wall of the first chamber is less than 90 degrees.

35. An apparatus as claimed in claim 1 wherein said at least one radiation absorbing surface includes a plurality of facets forming a generally sawtooth pattern in said surface, respective adjacent facets being disposed at less than 90 degrees to each other.

36. A method of rapidly and uniformly heating a workpiece, the method comprising the steps of:
   a) directing radiation from a first radiation source at a first surface of said workpiece to produce radiation incident upon said first surface; and,
   b) particularly absorbing radiation reflected and radiation emitted from energy transfer surfaces including the first surface and surfaces in the vicinity of said first surface so that the first surface is exposed primarily only to radiation emitted directly from the radiation source.

37. A method as claimed in claim 36 further including the steps of:
   a) holding said workpiece in a first chamber;
   b) admitting said radiation into said first chamber; and
   c) particularly absorbing said radiation reflected and radiation emitted from said energy transfer surfaces on radiation absorbing surfaces of at least one wall forming said first chamber.

38. A method as claimed in claim 37 including the step of reflecting the radiation from said first radiation source to achieve a desired radiation pattern incident on said workpiece.

39. A method as claimed in claim 36 further including the step of directing said radiation at said first surface at an angle of incidence less than 80 degrees to said first surface.

40. A method as claimed in claim 37 further including the step of directing said radiation through a window having a partially reflecting surface disposed at an angle to said first surface for directing said non-incident radiation impinging upon said partially reflecting surface toward at least one of said radiation absorbing surfaces.

41. A method as claimed in claim 40 further including the step of cooling said window through contact with a cooling fluid.

42. A method as claimed in claim 36 further including the step of reflecting back to a second surface of said workpiece substantially all of the radiation emitted by said second surface to reduce the effects of differences in heat coefficients in different areas of said workpiece, said second surface of said workpiece being disposed on a side opposite said first side, the step of reflecting employing a second reflecting surface disposed opposite the second surface.

43. A method as claimed in claim 36 further including the step of reflecting back to a second surface and edges of said workpiece substantially all of the radiation emitted by said second surface and edges of said workpiece.

44. A method as claimed in claim 43 wherein the step of reflecting back includes the step of reflecting radiation emitted from said second surface and said edges with a shaped reflector disposed opposite said second surface and said edges, said reflector being shaped to distribute reflected radiation back to said second surface and said edges such that a generally uniform temperature distribution is maintained over said second surface and said edges.

45. A method as claimed in claim 36 further including the step of irradiating a second surface of said workpiece, with a second source of radiation, said second surface being on a side of said workpiece, opposite said first surface.

46. A method as claimed in claim 45 further including the step of reflecting radiation from said second source of radiation to achieve a desired radiation pattern on said workpiece.

47. A method of rapidly and uniformly heating a workpiece, the method comprising the steps of:
   a) directing radiation from a first radiation source at a first surface of said workpiece to produce radiation incident upon said first surface;
   b) directing radiation from a second radiation source at a second surface of said workpiece to produce radiation incident upon said second surface, said first and second surfaces being disposed on opposite sides of said workpiece; and,
   c) particularly absorbing radiation reflected and radiation emitted from energy transfer surfaces, including the first and second surfaces and surfaces in the vicinity of said workpiece.

48. A method as claimed in claim 47 further including the steps of:
   a) holding said workpiece in a chamber having a plurality of walls, at least one wall having a radiation absorbing surface;
   b) admitting said radiation from said first and second sources into said chamber; and
   c) absorbing said radiation that is reflected and emitted on the radiation absorbing surface of said at least one wall.

49. A method as claimed in claim 48 further including the step of reflecting the radiation from said first and second radiation sources to achieve a desired radiation pattern incident on said workpiece.

50. A method as claimed in claim 49 further including the step of reflecting radiation from said first source from a first reflector disposed behind said first source and reflecting radiation from said second source from a second reflector disposed behind said second source.

* * * * *